United States Patent
Shu et al.

(10) Patent No.: US 9,711,447 B1
(45) Date of Patent: Jul. 18, 2017

(54) SELF-ALIGNED LITHOGRAPHIC PATTERNING WITH VARIABLE SPACINGS

(71) Applicant: GLOBALFOUNDRIES Inc., Grand Cayman (KY)

(72) Inventors: Jiehui Shu, Clifton Park, NY (US); Qiang Fang, Ballston Lake, NY (US); Daniel W. Fisher, Clifton Park, NY (US); Haigou Huang, Rexford, NY (US); Jinping Liu, Ballston Lake, NY (US); Haifeng Sheng, Rexford, NY (US); Zhiguo Sun, Halfmoon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/290,277

(22) Filed: Oct. 11, 2016

(51) Int. Cl.
| | |
|---|---|
| *H01L 23/48* | (2006.01) |
| *H01L 23/522* | (2006.01) |
| *H01L 23/528* | (2006.01) |
| *H01L 21/768* | (2006.01) |

(52) U.S. Cl.
CPC .... *H01L 23/5221* (2013.01); *H01L 21/76807* (2013.01); *H01L 21/76829* (2013.01); *H01L 21/76877* (2013.01); *H01L 23/528* (2013.01); *H01L 23/5226* (2013.01)

(58) Field of Classification Search
CPC ............ H01L 23/5221; H01L 23/5226; H01L 23/528; H01L 21/76807; H01L 21/76829; H01L 21/76877
USPC ......................................................... 257/773
See application file for complete search history.

(56) References Cited

U.S. PATENT DOCUMENTS

| | | | |
|---|---|---|---|
| 8,610,275 B2 * | 12/2013 | Zhu ..................... | H01L 23/5226 257/751 |
| 9,177,797 B2 | 11/2015 | Chang et al. | |
| 9,240,346 B2 * | 1/2016 | Lee ................... | H01L 21/76816 |

* cited by examiner

*Primary Examiner* — Tu-Tu Ho
(74) *Attorney, Agent, or Firm* — Thompson Hine LLP; Anthony Canale

(57) ABSTRACT

Methods of lithographic patterning and structures formed by lithographic patterning. A hardmask layer is formed on a dielectric layer, a feature is formed on the hardmask layer, and a mandrel is formed that extends in a first direction across the first feature. The mandrel and the hardmask layer beneath the mandrel are removed to pattern the hardmask layer with the feature masking a section of the hardmask layer. After the hardmask layer is patterned, the dielectric layer is etched to form a first trench and a second trench that are separated by a section of the dielectric layer masked by the section of the hardmask layer. The first trench and the second trench are filled with a conductor layer to respectively form a first wire and a second wire that is separated from the first wire by the section of the dielectric layer.

20 Claims, 5 Drawing Sheets

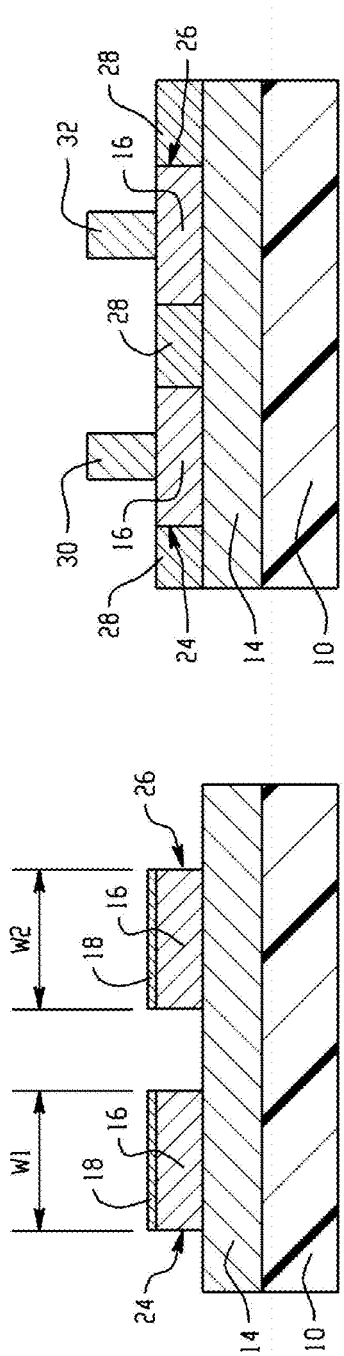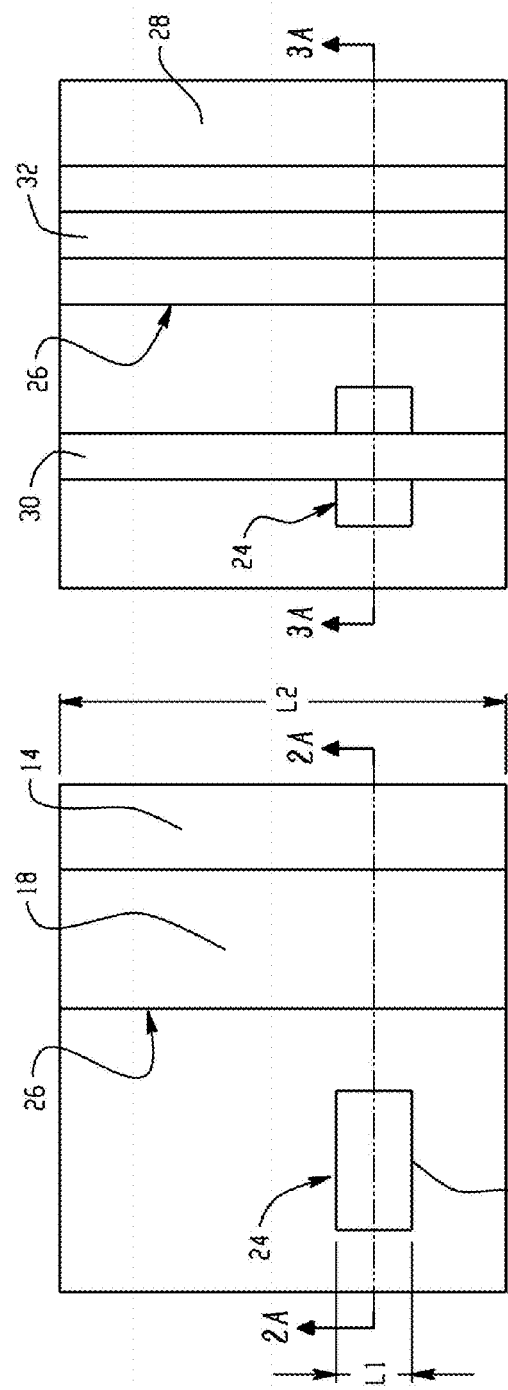

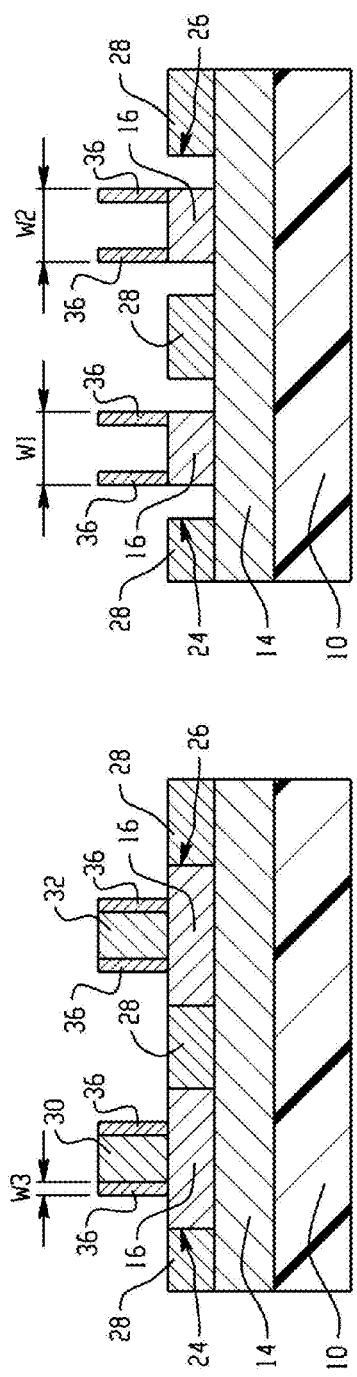
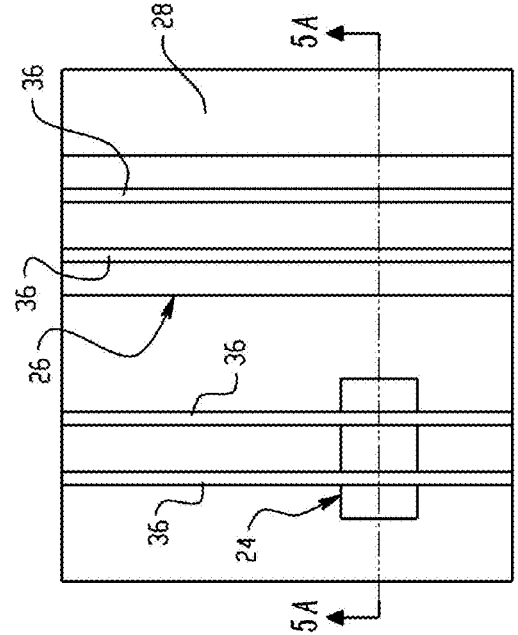
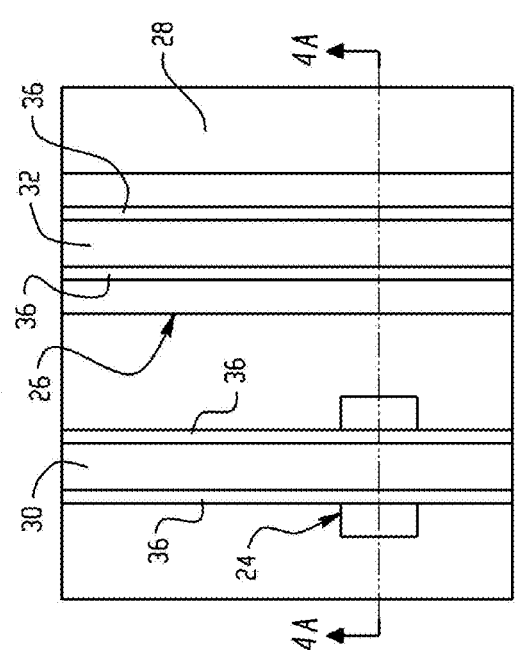
Fig. 4
Fig. 4A
Fig. 5
Fig. 5A

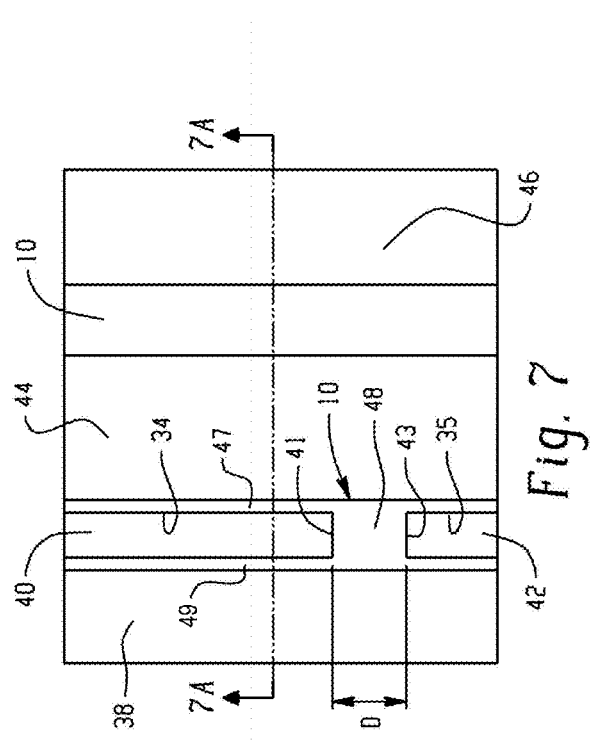
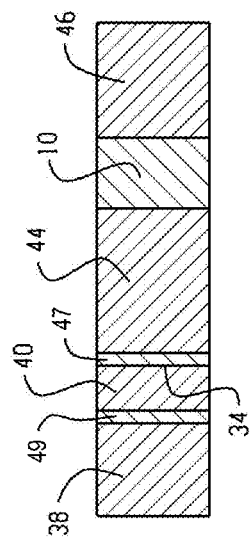
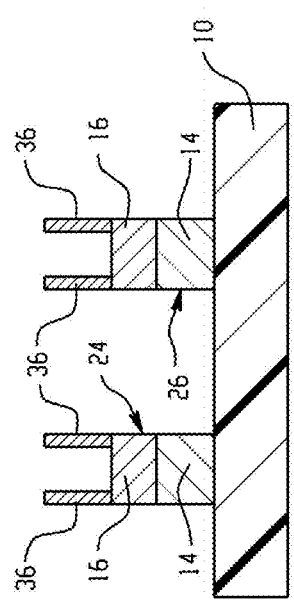
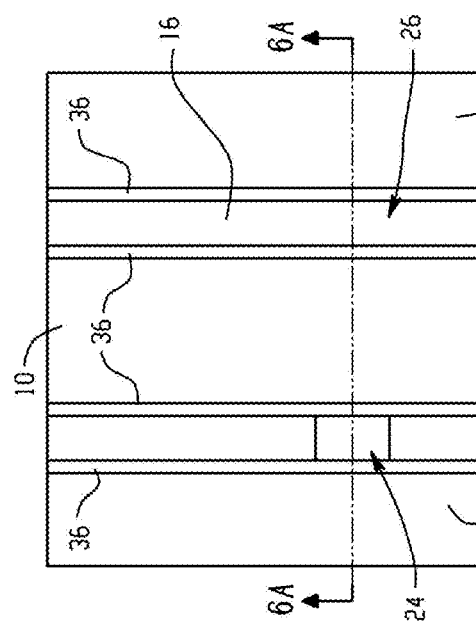
Fig. 7
Fig. 7A
Fig. 6
Fig. 6A

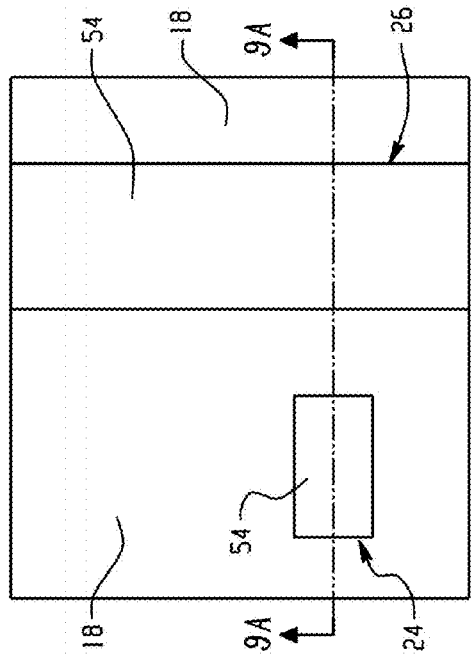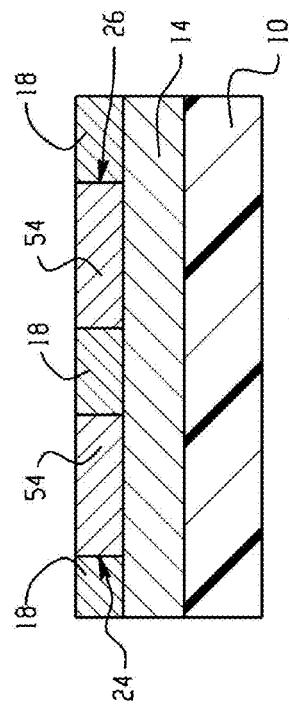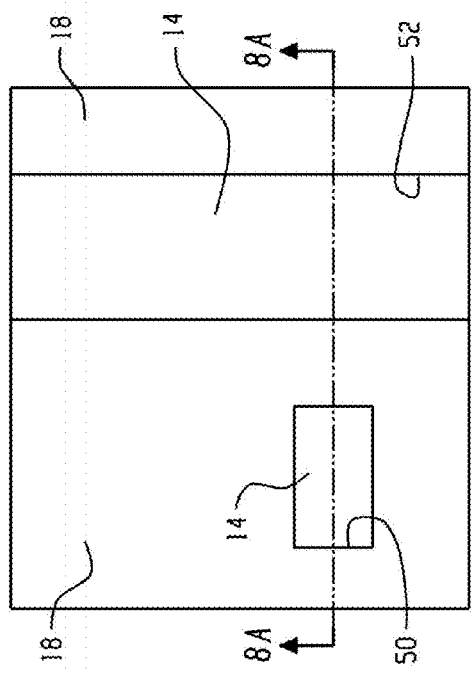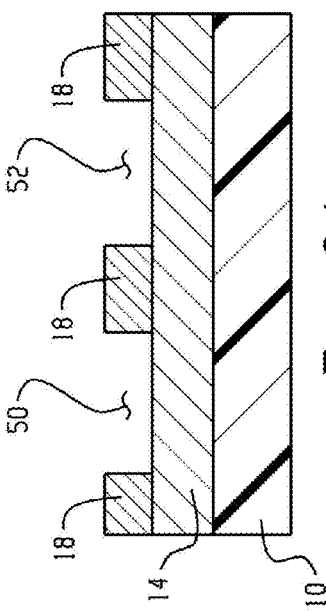

SELF-ALIGNED LITHOGRAPHIC PATTERNING WITH VARIABLE SPACINGS

BACKGROUND

The present invention relates to integrated circuits and semiconductor device fabrication and, more specifically, to methods of lithographic patterning and structures formed by lithographic patterning.

A back-end-of-line (BEOL) interconnect structure may be used to electrically couple device structures fabricated on a substrate during front-end-of-line (FEOL) processing. The BEOL interconnect structure may be formed using a dual-damascene process in which via openings and trenches etching in a dielectric layer are simultaneously filled with metal to create a metallization level. In a via-first, trench-last dual damascene process in which via openings are formed in a dielectric layer and then a trench is formed in the dielectric layer above the via openings, the via openings are unfilled during the etching process forming the trenches. In a single-damascene process, the via openings and trench are formed in different dielectric layers and filled separately with metal.

Self-aligned patterning processes involve the use of mandrels as sacrificial structures. Sidewall spacers, which have a thickness less than that permitted by the current ground rules for optical lithography, are formed on the vertical sidewalls of the mandrels. After selective removal of the mandrels, the sidewall spacers are used as an etch mask to etch an underlying hardmask and dielectric layer, for example, with a directional reactive ion etching (RIE). Because the sidewall spacers may have a sublithographic line pitch and width, the features formed in underlying dielectric layer will also have a sublithographic line pitch and width.

A cut may be formed in a mandrel with a cut mask and etching in order to section the mandrel and define a gap that subsequently is used to form adjacent wires that are spaced apart at their ends or tips with a tip-to-tip spacing. In spacer-based lithography processes, the tip-to-tip spacing between adjacent sections of the cut mandrel is restricted to a distance that is less than twice the thickness of the sidewall spacers. If the tip-to-tip spacing is greater than twice the thickness of the sidewall spacers, then the sidewall spacers may fail to merge across the width of the cut.

Improved methods of lithographic patterning and structures formed by lithographic patterning are needed.

SUMMARY

In an embodiment of the invention, a method includes forming a hardmask layer on a dielectric layer, forming a feature on the hardmask layer, and forming a mandrel that extends in a first direction across the feature. The method further includes removing the mandrel and the hardmask layer beneath the mandrel to pattern the hardmask layer with the first feature masking a section of the hardmask layer. After the hardmask layer is patterned, the dielectric layer is etched to form a first trench and a second trench that is separated by a section of the dielectric layer masked by the section of the hardmask layer. The first trench and the second trench are filled with a conductor layer to respectively form a first wire and a second wire that is separated from the first wire by the section of the dielectric layer.

In an embodiment of the invention, a structure includes a first wire having a first tip and a side edge that terminates at the first tip, as well as a second wire having a second tip separated in a first direction from the first tip by a gap. The structure includes a dielectric layer with a section located in the gap between the first tip of the first wire and the second tip of the second wire and a strip adjacent to the side edge of the first wire. The strip has with a length extending in the first direction and a width extending in a second direction perpendicular to the first direction. The section of the dielectric layer has a length in the first direction that is greater than the width of the strip.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2 is a top view of the layer stack of FIG. 1 at a subsequent stage of the processing method.

FIG. 2A is a cross-sectional view taken generally along line 2A-2A in FIG. 2.

FIG. 3 is a top view of the layer stack of FIG. 2 at a subsequent stage of the processing method.

FIG. 3A is a cross-sectional view taken generally along line 3A-3A in FIG. 3.

FIG. 4 is a top view of the layer stack of FIG. 3 at a subsequent stage of the processing method.

FIG. 4A is a cross-sectional view taken generally along line 4A-4A in FIG. 4.

FIG. 5 is a top view of the layer stack of FIG. 4 at a subsequent stage of the processing method.

FIG. 5A is a cross-sectional view taken generally along line 5A-5A in FIG. 5.

FIG. 6 is a top view of the layer stack of FIG. 5 at a subsequent stage of the processing method.

FIG. 6A is a cross-sectional view taken generally along line 6A-6A in FIG. 6.

FIG. 7 is a top view of the layer stack of FIG. 6 at a subsequent stage of the processing method.

FIG. 7A is a cross-sectional view taken generally along line 7A-7A in FIG. 7.

FIG. 8 is a top view of a layer stack similar to the layer stack of FIG. 1 at a subsequent stage of a processing method in accordance with alternative embodiments of the invention.

FIG. 8A is a cross-sectional view taken generally along line 8A-8A in FIG. 8.

FIG. 9 is a top view of the layer stack of FIG. 8 at a subsequent stage of the processing method.

FIG. 9A is a cross-sectional view taken generally along line 9A-9A in FIG. 9.

DETAILED DESCRIPTION

Figure 1:
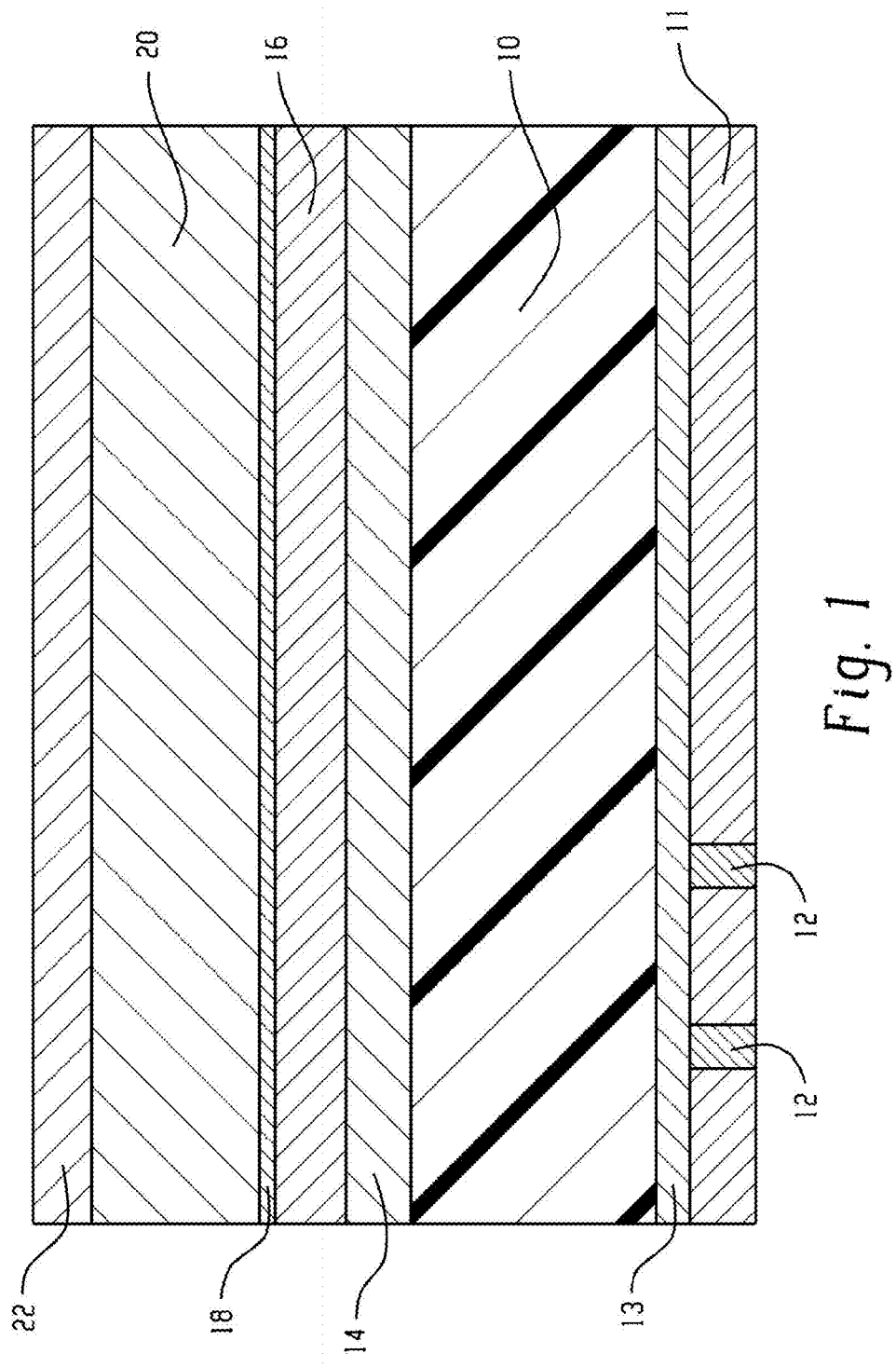
FIG. 1 is a cross-sectional view of a layer stack on substrate at an initial stage of a processing method in accordance with embodiments of the invention.

With reference to FIG. 1 and in accordance with embodiments of the invention, a dielectric layer 10 is processed according to the processing method to form an interconnect structure of a metallization level. The dielectric layer 10 may be composed of an electrically-insulating dielectric material, such as hydrogen-enriched silicon oxycarbide (SiCOH) produced from an octamethylcyclotetrasiloxane (OMCTS) precursor or another type of low-k dielectric material. The dielectric layer 10 may be located on a substrate comprised of, for example, a semiconductor material suitable for forming an integrated circuit and including device structures fabricated by front-end-of-line (FEOL) processing to form the integrated circuit. The dielectric layer 10 may include a capping layer (not shown) of, for example, silicon nitride ($Si_3N_4$) that protects the integrity of the dielectric layer 10 during hardmask patterning.

A dielectric layer 11 underlies the dielectric layer 10 and includes features 12 that are embedded in the dielectric layer 11. The features 12 may be portions of the FEOL device structures or another type of feature, such as contacts or vias that are coupled with portions of the FEOL device structures. The dielectric layer 11 may be separated from the dielectric layer 10 by an etch stop layer 13 comprised of, for example, silicon carbon nitride (SiCN) or nitrogen-doped silicon carbide, commonly known as NBloK.

Layers 14, 16, 18 and layers 20, 22 are serially formed in a layer stack on a top surface of the dielectric layer 10. The layer 14 may be constituted by a metal hardmask material, such as titanium nitride (TiN) deposited by physical vapor deposition (PVD) or atomic layer deposition (ALD). The layer 16 may be constituted by amorphous carbon (C) deposited by chemical vapor deposition (CVD), and may etch selective to the material of hardmask layer 14. The layer 18 may be constituted by silicon nitride ($Si_3N_4$) deposited by CVD. The layers 20, 22 may be a hardmask that is patterned and then used to pattern layers 16, 18 to form another hardmask that is used to pattern the dielectric layer 10. The material constituting the layer 20 may be hydrogen-enriched silicon oxycarbide (SiCOH) deposited by CVD and the material constituting the layer 22 may be silicon oxynitride (SiON) deposited by CVD. Notably, the layer stack does not include a constituent layer that is comprised of amorphous silicon.

With reference to FIGS. 2, 2A in which like reference numerals refer to like features in FIG. 1 and at a subsequent fabrication stage, a photoresist layer (not shown) may be applied to layer 22 (FIG. 1) by spin-coating, pre-baked, exposed to a pattern of radiation from an exposure source projected through a photomask, baked after exposure, and developed with a chemical developer to form features that are situated at the intended locations for corresponding features to be formed in the layers 20, 22. With the photoresist layer present, the features are formed in the layers 20, 22 using an etching process, such as reactive-ion etching (RIE). After the photoresist layer is stripped, the pattern of features in the layers 20, 22 may be transferred by one or more etching processes, such as RIE, to the layers 16, 18, which forms features 24, 26 having the same pattern. The etching process may remove the materials constituting layers 20, 22 selective to the materials constituting layers 16, 18 and may stop on the material of the hardmask layer 14. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

After the layers 16, 18 are patterned to form features 24, 26, layers 20, 22 are removed by etching and/or chemical mechanical polishing (CMP) process. As best shown in FIG. 2A, the features 24, 26 have a side-by-side arrangement but are formed with different dimensions. The feature 24 has a width W1 and a length L1, whereas the feature 26 has a width W2 that may be comparable to the width W1 and a length L2 that is greater than the length L1. The feature 24 may be used to make a cut inside of a subsequently-formed mandrel for the purpose of providing a variable tip-to-tip spacing between the lengthwise-aligned and shortened pair of mandrels formed from the original mandrel following the cut. The feature 26 may be used to cut an entire subsequently-formed mandrel for the purpose of providing a variable spacing in a direction of the widths between adjacent mandrels.

With reference to FIGS. 3, 3A in which like reference numerals refer to like features in FIGS. 2, 2A and at a subsequent fabrication stage, a layer 28 of a material, such as silicon nitride ($Si_3N_4$), is deposited by CVD and planarized by a CMP process. Sections of layer 28 fill the gaps between the features 24, 26 and re-establish a flat top surface with features 24, 26 embedded in the polished layer 28. The sections of layer 18 are removed from the respective top surfaces of the features 24, 26 during planarization of layer 28 such that the features 24, 26 are exclusively constituted by the material of layer 16.

Mandrels 30, 32 are formed on the flat top surface by patterning a layer of their constituent material with photolithography and etching. The mandrels 30, 32 may be constituted by a material that can be removed selective to the material of the features 24, 26. The mandrels 30, 32 are aligned with a lengthwise parallel arrangement and a spacing in relation to their respective widths. Mandrel 30 is arranged to overlap with and extend across the feature 24, and mandrel 32 is arranged to overlap with the feature 26. More specifically, the length of the mandrel 30 is greater than the length of the feature 24, and the mandrel 30 and the feature 24 are placed in the layout such that the mandrel 30 extends across the full length of the feature 24. In addition, the length and placement of the mandrel 32 and the feature 26 may be selected such that the mandrel 32 extends over the entire length of the feature 26. The width of the mandrels 30, 32 is less than the width of the features 24, 26 with which each is respectively associated, and the mandrels 30, 32 may each be centered in the width direction relative to the associated one of the features 24, 26.

With reference to FIGS. 4, 4A in which like reference numerals refer to like features in FIGS. 3, 3A and at a subsequent fabrication stage, sidewall spacers 36 are formed on the vertical sidewalls of the mandrels 30, 32. The sidewall spacers 36 may be formed by depositing a conformal layer comprised of a dielectric material, such as silicon dioxide ($SiO_2$) deposited by ALD, and shaping the conformal layer with an anisotropic etching process, such as RIE, that preferentially removes the dielectric material from horizontal surfaces, such as the top surfaces of the layer 28, features 24, 26, and mandrels 30, 32. The material constituting the sidewall spacers 36 may be chosen such that the mandrels 30, 32 can be selectively removed relative to the sidewall spacers 36.

The sidewall spacers 36 have a width, w3, that may be nominally equal to the thickness of the deposited conformal layer. The collective width of the sidewall spacers 36 and the mandrel 30 is less than the width of feature 24, and the collective width of the sidewall spacers 36 and the mandrel 32 is less than the width of feature 26. The sidewall spacers 36 have a length in a lengthwise direction perpendicular to their widths and parallel to the lengths of the mandrels 30, 32, and the length of the sidewall spacers 36 on mandrel 30 is greater than the length of the feature 24 as is the case for the mandrel 30.

With reference to FIGS. 5, 5A in which like reference numerals refer to like features in FIGS. 4, 4A and at a subsequent fabrication stage, an etching process is applied to selectively remove the portions of the features 24, 26 that are not masked by the mandrels 30, 32 and sidewall spacers 36.

A portion of the feature 24 remains intact and embedded at the level of the layer 28 between the parallel and neighboring sidewall spacers 36 on mandrel 30, and portions of the feature 24 outside of these sidewall spacers 36 are removed to expose the underlying material of hardmask layer 14. The width W1 of the feature 24 is reduced by the etching process, and the reduced width of the feature 24 may be equal to a sum of the width of the mandrel 30 and twice the width of the sidewall spacers 36 cladding mandrel 30. A portion of the feature 26 remains intact between the parallel and neighboring sidewall spacers 36 on mandrel 32, and portions of the feature 26 outside of these sidewall spacers 36 are removed to expose the underlying material of hardmask layer 14. The etching process that narrows the features 24, 26 may be selected to stop on the material of hardmask layer 14 and may remove the material of the features 24, 26 selective to the materials of the sidewall spacers 36, mandrels 30, 32, and layer 28. The width W2 of the feature 26 is reduced by the etching process, and the reduced feature width may be equal to a sum of the width of the mandrel 32 and twice the width of the sidewall spacers 36 on the sidewalls of the mandrel 32. The reduced width of the feature 24 and the reduced width of the feature 26 may be equal. The length of feature 24 and the length of feature 26 are unaffected by the narrowing of their respective widths.

After the features 24, 26 are narrowed, the mandrels 30, 32 may be removed with an etching process having a suitable etch chemistry. The etching process that pulls the mandrels 30, 32 may be selected to stop on the material of layer 16 constituting the features 24, 26 and may be selective to the materials of the sidewall spacers 36 and layer 28.

With reference to FIGS. 6, 6A in which like reference numerals refer to like features in FIGS. 5, 5A and at a subsequent fabrication stage, the material of the layer 28 is removed from hardmask layer 14 by an etching process that stops on the material of hardmask layer 14 and that removes the layer 28 selective to the materials of the features 24, 26 and the sidewall spacers 36. Hardmask layer 14 is then patterned using the features 24, 26 by an etching process that stops on the material of layer 10 and that removes hardmask layer 14 selective to the materials of the features 24, 26 and the sidewall spacers 36. Portions of hardmask layer 14 are preserved beneath the features 24 and 26, and portions of hardmask layer 14 are also preserved in lengthwise strips beneath the sidewall spacers 36 where the feature 24 is absent.

With reference to FIGS. 7, 7A in which like reference numerals refer to like features in FIGS. 6, 6A and at a subsequent fabrication stage, the dielectric layer 10 is etched using the patterned material of hardmask layer 14 as a hardmask to form trenches at the unmasked locations. After the dielectric layer 10 is etched, the materials of the patterned layer 14, the features 24, 26, and the sidewall spacers 36 are removed by etching processes. In an embodiment, the sidewall spacers 36 may be removed from the features 24, 26 and the patterned layer 14 before the dielectric layer 10 is etched.

The trenches in the dielectric layer 10 are filled with a conductor to form wires 38, 40, 42, 44, 46. In particular, the wire 40 is located in a trench 34 defined by the masked etching in the dielectric layer 10 and the wire 42 is located in a trench 35 defined by the masked etching in the dielectric layer 10. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches before filling with the metal. The wires 38, 40, 42, 44, 46 may be comprised of a low-resistivity conductor formed using a deposition process, such as a metal like copper (Cu) formed by electroplating or electroless deposition.

Wire 40 has an end or tip 41 and wire 42 has an end or tip 43 that is located adjacent to the tip 41 of wire 40 in a spaced apart relationship. The wires 40, 42 are lengthwise aligned in a row and the tips 41, 43 represent respective surfaces that extend in the lengthwise direction of the wires 40, 42. The tip 41 of wire 40 and the tip 43 of wire 42 are separated by an end-to-end or tip-to-tip distance, D, and this gap is filled by a portion 48 of the dielectric layer 10, which provides a discontinuity and functions to electrically isolate the wires 40, 42 from each other. The tip-to-tip distance, D, between a plane containing the tip 41 of wire 40 and a plane containing the tip 43 of wire 42 in a lengthwise direction is equal to the length, L1, of the feature 24 as shown in FIG. 2. During the etching process forming the trenches 34, 35, the portion 48 of the dielectric layer 10 is masked by the feature 24 and the underlying portion of hardmask layer 14. The wire 40 has side edges that terminate at its tip 41, and the wire 42 has side edges that terminate at its tip 43. These side edges of the wires 40, 42 are coextensive with the sidewalls of the trenches 34, 35.

The wires 40, 42 are each laterally bounded by portions or strips 47, 49 of the dielectric layer 10 that are also masked during the etching process by respective portions of the hardmask layer 14 and, if the sidewall spacers 36 not removed before etching, by the sidewall spacers 36 overlying these respective portions of the hardmask layer 14. The strips 47, 49 have lengths in a direction parallel to the length of the feature 24 and therefore parallel to the length the portion 48 of the dielectric layer 10. The strips 47, 49 of dielectric material are located at the opposite side edges of the wires 40, 42. One of these strips 47 of dielectric material is located between wires 40, 42 and wire 44, and another of these strips 49 of dielectric material is located between wires 40, 42 and wire 38. The strips 47, 49 merge with the portion 48 such that the portion 48 and the strips 47, 49 of the dielectric layer 10 define a continuous body of dielectric material that establishes outer boundaries for the wires 40, 42.

The tip-to-tip distance between the tip 41 of wire 40 and the tip 43 of wire 42 is not defined by a cut made in the mandrel 30 and, consequently, is not limited to being less than twice the width of the sidewall spacers 36. Consequently, tip-to-tip distance may be greater than twice the width of the sidewall spacers 36 and also greater than twice the width of the strips 47, 49 that are patterned based on the patterning of the hardmask layer 14 as masked by the sidewall spacers 36 during etching.

With reference to FIGS. 8, 8A in which like reference numerals refer to like features in FIGS. 2, 2A and in accordance with alternative embodiments of the invention, the features 24, 26 may be formed in a different manner. To that end and referring to the vertical arrangement of layers formed on the dielectric layer 12 as shown in FIG. 1, the layer 16 of amorphous carbon (C) may be omitted from the layer stack and the layer 18 of silicon nitride ($Si_3N_4$) may be thickened such that the subsequently formed features 24, 26 has a desired thickness related to the thickness of layer 18. Layer 18 may be patterned, in a manner similar to the patterning of layers 16, 18, to form openings 50, 52 that extend to the depth of hardmask layer 14.

With reference to FIGS. 9, 9A in which like reference numerals refer to like features in FIGS. 8, 8A and at a subsequent fabrication stage, a layer 54 of a material, such as amorphous carbon (C), is deposited by CVD and planarized by a CMP process. Sections of layer 54 fill the openings 50, 52 to form the features 24, 26 and a flat top surface is established, following polishing, with features 24, 26 coplanar with the polished layer 54. The features 24, 26 are embedded in the polished layer 54. Mandrels 30, 32 are subsequently formed that respectively overlap the features 24, 26 as described in the context of FIGS. 3, 3A, and the process flow continues with the fabrication stage of FIGS. 4, 4A.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a hardmask layer on a dielectric layer;
   forming a first feature on the hardmask layer;
   forming a first mandrel that extends in a first direction across the first feature;
   removing the first mandrel and the hardmask layer beneath the first mandrel to pattern the hardmask layer with the first feature masking a first section of the hardmask layer; and
   after the hardmask layer is patterned, etching the dielectric layer to form a first trench and a second trench separated by a section of the dielectric layer masked by the first section of the hardmask layer; and
   filling the first trench and the second trench with a conductor layer to respectively form a first wire and a second wire separated from the first wire by the section of the dielectric layer.

2. The method of claim 1 further comprising:
   forming a sidewall spacer on the first mandrel,
   wherein the sidewall spacer extends in the first direction across the first feature.

3. The method of claim 2 wherein a portion of the first feature is located peripherally outside of the sidewall spacer in a second direction perpendicular to the first direction, and further comprising:
   removing the portion of the first feature before the hardmask layer is patterned.

4. The method of claim 2 wherein the sidewall spacer is formed on the first mandrel before the dielectric layer is etched to form the first trench and the second trench.

5. The method of claim 2 wherein the first wire and the second wire have a tip-to-tip spacing based on a length of the first feature in the first direction.

6. The method of claim 5 wherein the length of the first feature is independent of a thickness of the sidewall spacer.

7. The method of claim 2 wherein the first feature has a dimension in the first direction parallel to a length of the first mandrel that is greater than twice a thickness of the sidewall spacer.

8. The method of claim 2 wherein the sidewall spacer masks the hardmask layer against removal when the first mandrel and the hardmask layer beneath the first mandrel are removed, and a second section of the hardmask layer beneath the sidewall spacer provides a boundary for the first trench and the second trench in a second direction perpendicular to the first direction after the hardmask layer is patterned.

9. The method of claim 2 wherein a second section of the hardmask layer beneath the sidewall spacer is masked when the hardmask layer is patterned.

10. The method of claim 1 wherein forming the first feature on the hardmask layer comprises:
    depositing a first layer on the hardmask layer;
    patterning the first layer to form the first feature; and
    after the first feature is formed, depositing a second layer in which the first feature is embedded.

11. The method of claim 10 further comprising:
    before the hardmask layer is patterned, removing the second layer selective to the first feature,
    wherein the hardmask layer is exposed for removal during patterning where the second layer is removed.

12. The method of claim 1 wherein forming the first feature on the hardmask layer comprises:
    depositing a first layer on the hardmask layer:
    patterning the first layer to form an opening; and
    after the opening is formed, depositing a second layer that fills the opening to form the first feature.

13. The method of claim 12 further comprising:
    before the hardmask layer is patterned, removing the first layer selective to the second layer,
    wherein the hardmask layer is exposed for removal during patterning where the first layer is removed.

14. The method of claim 1 further comprising:
    forming a second feature on the hardmask layer;
    wherein a third trench is formed between the first trench and the second feature when the dielectric layer is etched, and a third wire is formed by a portion of the conductor layer filling in the third trench.

15. The method of claim 14 further comprising:
before the dielectric layer is etched, forming a second mandrel that extends in the first direction across the second feature; and
removing the second mandrel and the hardmask layer beneath the second mandrel to pattern the hardmask layer with the second feature masking a second section of the hardmask layer,
wherein the third trench is formed laterally between the first section of the hardmask layer and the second section of the hardmask layer.

16. The method of claim 1 further comprising:
after the dielectric layer is etched to form the first trench and the second trench, removing the first feature before the first trench and the second trench are filled with the conductor layer to respectively form the first wire and the second wire.

17. A structure comprising:
a first wire having a first tip and a side edge that terminates at the first tip;
a second wire having a second tip separated in a first direction from the first tip by a gap; and
a dielectric layer including a strip adjacent to the side edge of the first wire and a section located in the gap between the first tip of the first wire and the second tip of the second wire, the section of the dielectric layer having a length in the first direction, and the strip having a width extending in a second direction perpendicular to the first direction,
wherein the length of the section of the dielectric layer is greater than the width of the strip.

18. The structure of claim 17 further comprising:
a third wire arranged in the first direction parallel with the first wire and the second wire,
wherein the strip of the dielectric layer is located laterally between the first wire and the third wire and is located laterally between the second wire and the third wire.

19. The structure of claim 17 wherein the first wire and the second wire are arranged in a row, the first wire has a width in the second direction, the second wire has a width in the second direction, and the width of the first wire is equal to the width of the second wire.

20. The structure of claim 19 wherein the section has a width in the second direction, the width of the section of the dielectric layer is greater than the width of the first wire, and the width of the section of the dielectric layer is greater than the width of the second wire.

* * * * *